United States Patent [19]

Aubert

[11] Patent Number: 5,014,032

[45] Date of Patent: May 7, 1991

[54] CYLINDRICAL PERMANENT MAGNET WITH LONGITUDINAL INDUCED FIELD

[75] Inventor: Guy Aubert, Grenoble, France

[73] Assignee: Centre National de la Recherche Scientifique, Paris, France

[21] Appl. No.: 353,640

[22] PCT Filed: Oct. 13, 1987

[86] PCT No.: PCT/FR87/00393

§ 371 Date: Apr. 14, 1989

§ 102(e) Date: Apr. 14, 1989

[87] PCT Pub. No.: WO88/02924

PCT Pub. Date: Apr. 21, 1988

[30] Foreign Application Priority Data

Oct. 17, 1986 [FR] France ............................. 86 14418

[51] Int. Cl.$^5$ ............................................. H01F 7/02
[52] U.S. Cl. ..................................... 335/306; 324/318
[58] Field of Search ............... 335/210, 212, 284, 306; 324/318, 319, 320

[56] References Cited

U.S. PATENT DOCUMENTS

| | | | |
|---|---|---|---|
| 3,237,059 | 2/1966 | Meyerer | 335/306 X |
| 3,768,054 | 10/1973 | Neugebauer. | |
| 4,658,228 | 4/1987 | Leupold | 335/304 X |
| 4,701,737 | 10/1987 | Leupold | 335/301 |

FOREIGN PATENT DOCUMENTS 2112645 7/1983 United Kingdom.

OTHER PUBLICATIONS

Patent Abstracts of Japan, vol. 10, No. 58, Mar. 7, 1986 & JP, A, 60210804.
Control Engineering, vol. 24, No. 11, Nov. 1977, A. S. Rashidi: "Rare Earth Magnets Improve Response in Linear Actuators", pp. 56–58.

Primary Examiner—George Harris
Attorney, Agent, or Firm—Oblon, Spivak, McClelland, Maier & Neustadt

[57] ABSTRACT

A cylindrical permanent magnet with a longitudinal induced field may be achieved by creating on either side of a zone of interest two annular structures magnetized on the one hand radially with respect to the cylinder axis and on the other hand antisymetrically with respect to the zone of interest. The annular structures may be achieved by arrangements of blocks on polygonal contours. In order to optimize fabrication, the number of blocks in each ring must be higher or equal to four times the number of rings in each structure. The magnet applies particularly to the field of imaging by nuclear magnetic resonance wherein the control logistics had originally been designed for longitudinal induction fields.

12 Claims, 3 Drawing Sheets

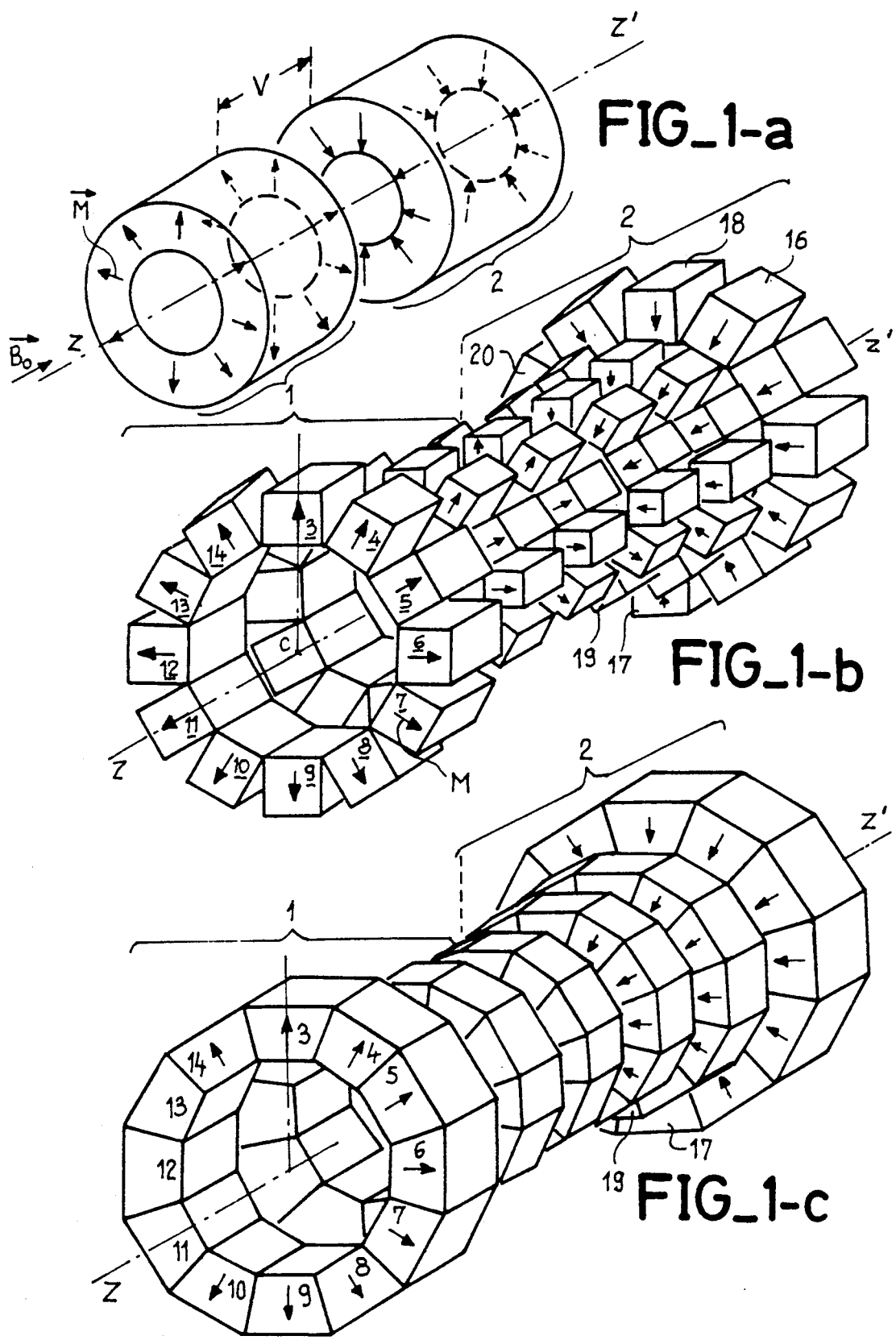

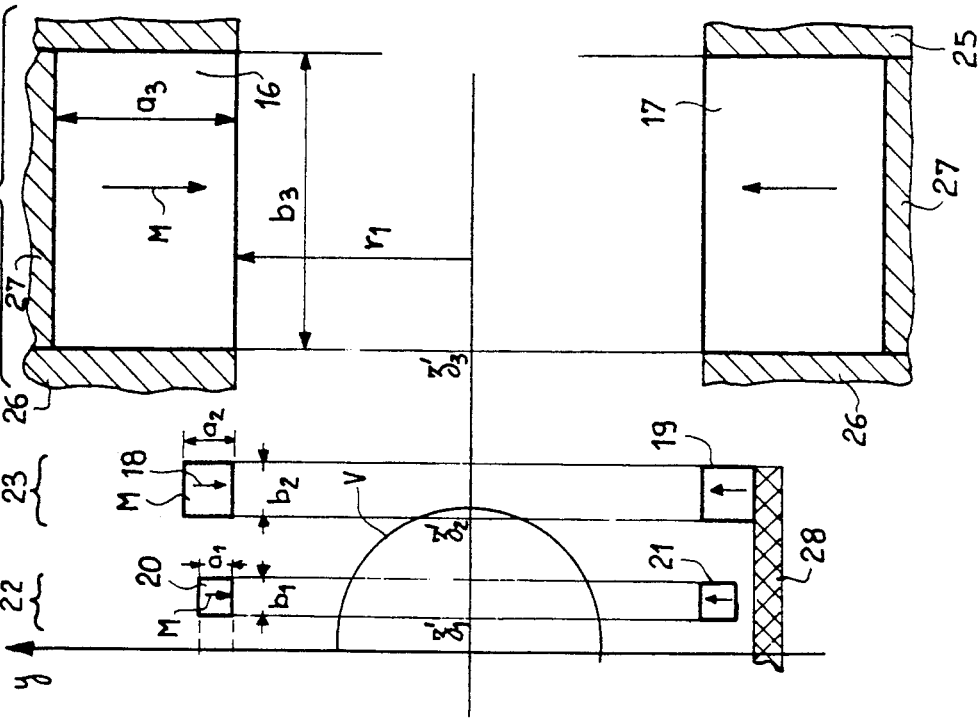
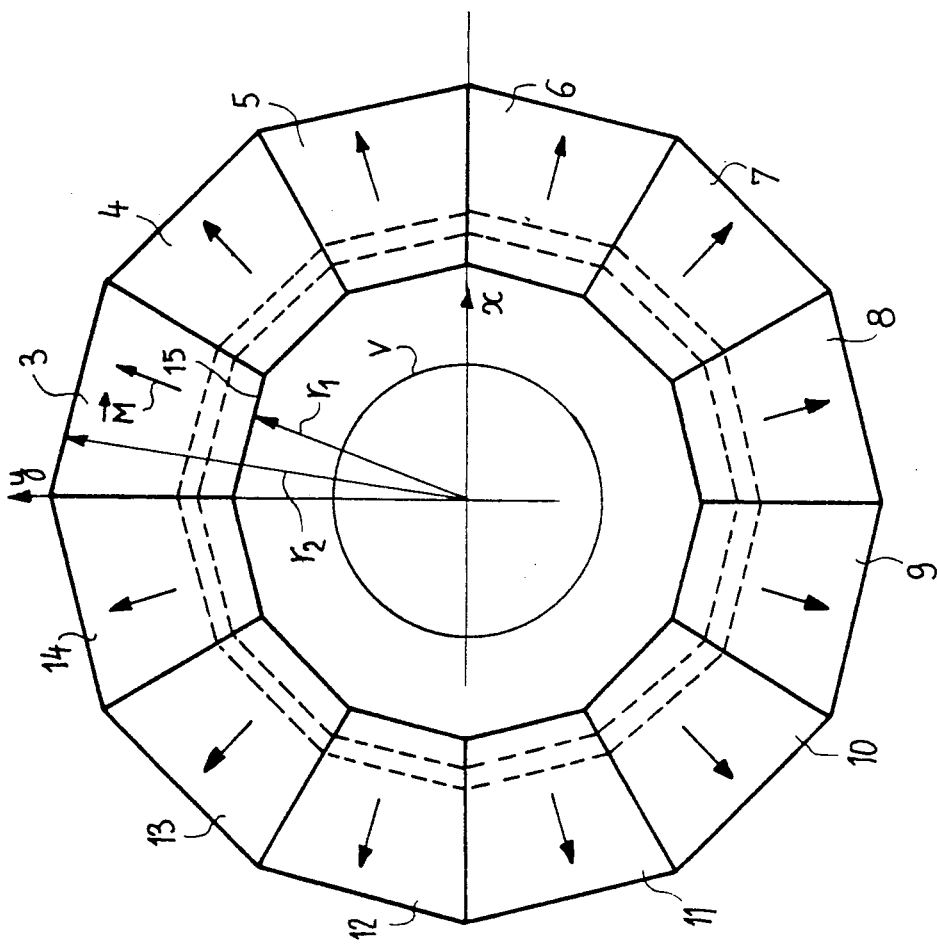

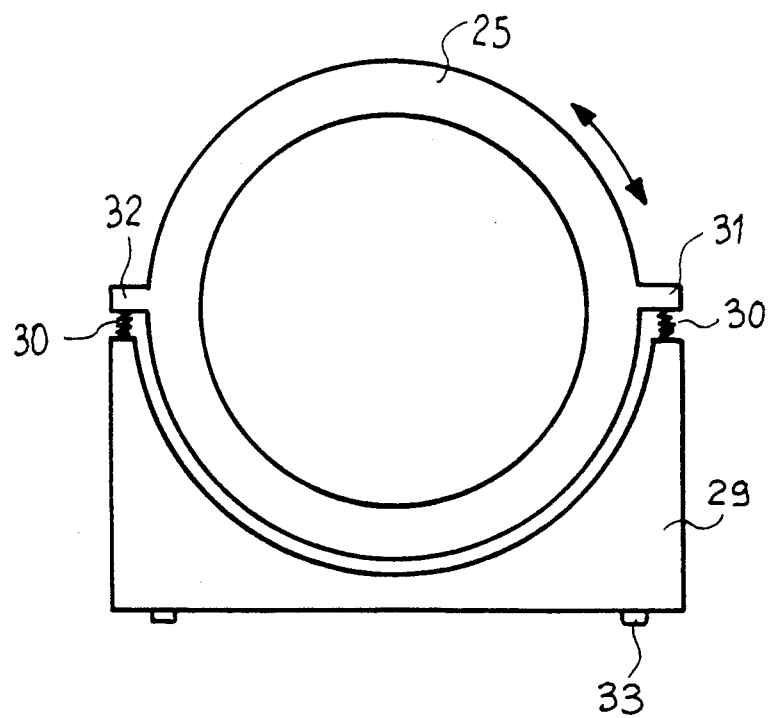

CYLINDRICAL PERMANENT MAGNET WITH LONGITUDINAL INDUCED FIELD

The present invention is due to Mr. Guy AUBERT, Director of the Service National des Champs Intenses, and it has, as an object, a cylindrical permanent magnet with longitudinal induced field. It finds application particularly in the medical field where magnets of this type are used in experiments of imaging by nuclear magnetic resonance for purposes of assistance in diagnosis. It can, nonetheless, find application in other fields where uniform induction fields are sought.

In the field of imaging by magnetic resonance, it is necessary to place the objects to be imaged, the patients, in a high magnetic induction field (usually of 0.1 to 1.5 Tesla) which is homogenous and uniform (with a few parts per million of variation) in a large volume of interest (commonly a sphere of 50 cm. diameter). Several classes of magnetic field generators have been developed until now. The main ones are: superconductive magnets, so-called resistive magnets and permanent magnets. Permanent magnets have many advantages. In particular, they require no energy supply to produce the field. They therefore do not run the risk of drift in their field value due to a drift of their supplies, or possibly of the system for discharging the dissipated heat. They call for no cooling means, in particular with sophisticated regulation techniques, for the flow of cryogenic fluids. Their working temperature is easily stabilized. They are furthermore particularly suited to the making of structures or systems producing a transversal main field, namely a field perpendicular to a direction in which objects, patients, are introduced into the magnet. Permanent cylindrical magnet structures, producing a uniform magnetic field, but one transversal to the cylinder, in a relatively high volume, have been described in the state of the art. In particular, in an international patent application No. WO 84/01226 filed on 23rd Sept. 1983 and published on 29th Mar. 1984, D. LEE et al. have described a magnet of this type.

Now, for historal and technical reasons (insufficiency of the intensity of the induced field produced by a permanent magnet), the first systems of imaging by magnetic resonance were designed for superconductive magnets or resistive magnets, the fields of which are longitudinal. The adoption of permanent magnet structures with a transversal field then leads to the advantages of these magnets only on condition that the knowhow acquired for the rest of the pieces of equipment of these systems is called into question. These items of ancillary equipment are, for example, a radio frequency antenna, gradient coils as well as field homogeneity correction devices. It is an object of the present invention to propose a cylindrical magnet, with permanent magnetization and a longitudinal induced field which enables the use of already existing items of equipment of systems for imaging by magnetic resonance. Under comparable conditions of use, in particular with equal effective volume of examination, the invention proposes a magnet for which the field intensity and, hence, the weight in magnetized magnetic materials is comparable to the new structures of permanent magnets with transversal fields.

It is known by the Patent Abstract of JAPAN vol 10, N° 58 (E-386) (2115) Mar. 7, 1986, JP-A-60 210 804 and by the UK Patent Application GB-A-2 112 645 structures with a longitudinal induced field. But the homogeneity of these field is insufficient, or, if sufficient, the entrance is not along the axis of this field.

The present invention concerns a cylindrical permanent magnet with cylindrical entrance and with a longitudinal induced field comprising two annular structures, placed on either side of the center of a zone of interest of the magnet, magnetized radially with respect to the cylinder axis with a magnetization which is divergent in one structure and convergent in the other, the structures each comprising several rings adjacent along said axis of said cylinder and, in each ring, several magnetic blocks, distributed on the of said rings, characterized in that the size of the blocks increases as their position is axially further away from the zone of interest.

The invention will be better understood from the reading of the following description and the examination of the accompanying FIG.. These FIG. are given purely by way of indication and in no way restrict the scope of the invention. The FIG. show:

FIGS. 1a to 1c: perspective views of cylindrical magnets in accordance with the invention;

FIGS. 2a and 2b: cross-section and longitudinal section respectively of the magnet of FIG. 1c.

FIG. 3: a detail of an assembly of the magnet of the invention.

FIGS. 1a to 1c represent, in perspective, cylindrical permanent magnets with a longitudinal induced field according to the invention. Their induced field is oriented along the axis z'z. The volume of interest of these magnets is located at their middle and in their hollow internal volume. It may be considered that this volume of interest has approximately the shape of a sphere. The magnets are each divided into two structures, 1 and 2 respectively which are annular, namely, for example, comprising a certain number of rings. These rings may be formed by magnetic blocks, such as 3 to 14 in FIG. 1b and 1c. The two structures of each magnet are arranged on either side of the zone of interest of these magnets and are both magnetized radially. The direction of the magnetizations M in the magnetic blocks are represented by arrows. The modulus of these magnetizations is constant at all points of the ring. In the blocks of structures 1, the magnetization is divergent, in the blocks of structures 2 it is convergent. In a preferred way, the two structures are symmetrical. They both comprise one and the same number $n_a$ of rings. They also comprise, in symmetrical rings, and when these rings are made with blocks, one and the same number $n_b$ of magnetic blocks distributed on the rim of the ring. In this case, the distribution of the magnetization is itself antisymmetrical. In a preferred way, all the rings of the magnet additionally have one and the same number $n_b$ of blocks. However, this is not an obligation. In particular, the number of rings in each structure could be different. Similarly, the number of blocks in each ring could be different from one ring to the other. It shall be seen further below that reasons of simplication of fabrication and reasons of optimum performance lead to the preferred solution and, in this preferred solution, to the geometrical symmetry of the structures 1 and 2, and to a particular number of blocks in the rings depending on the number of rings in the magnet.

FIG. 1a corresponds to a theoretical distribution of the magnetization which leads to the desired solution. But, at the present time, it is not known how to magnetize a magnetic material with a pure radial distribution. Hence, this distribution is approximated by a pseudo-radial distribution. In this pseudo-radial distribution, a ring is formed by a set of magnetized blocks. In the preferred embodiment of FIG. 1c, the blocks have a trapezoidal section (perpendicular to the induced field). In an embodiment which is simpler to fabricate, FIG. 1b, the blocks are replaced by rectangle parallelepipeds. In this solution which is simpler to fabricate, the consumption of magnetic material to obtain a given field in a fixed volume is nevertheless greater.

FIG. 2a shows a cross-section of a ring of the structure 1: for example, the ring of the blocks 3 to 14 of FIG. 1c. The magnetic blocks with magnetization M which is constant and identical in modulus and in direction in all the blocks are attached to one another by their base such as 15. They circumscribe the volume of interest of the magnet in a corresponding polygonal base prism. FIG. 2b shows a longitudinal section of one half of the magnet according to the invention: that of the structure 2. This structure, in a preferred way, comprises three rings 22 to 24, and, in each ring, twelve identical blocks. The rings are placed longitudinally to the axis z z'. The rings preferably have one and the same internal diameter $r_1$. This characteristic is favorable to the highest field homogeneity compatible with a minimum mass of magnetic material. It is furthermore favorable to an optimum use of the volume V of interest within the magnet. It has been found that this preferred solution, leading to blocks such as 16 to 29, the heights a and b and the lengths b of which increase with distance from the median plane of the ring to which they belong.

It is possible to give an analytic expression, as the case may be in cylindrical or spherical coordinates, of the value of the field $B_O$ as a function of the coordinates of the locations of the space, of the sphere of interest V, where this field prevails. This analytic expression may be put in a polynomial form wherein the terms, which are a function of the increasing powers of the variables x, y and z, are assigned coefficients which are representative of the homogeneity of the field produced. It is known that it can be stated that an induction field produced is homogeneous to a given order h if the coefficients of these terms are null up to and including the power h terms. It was then discovered that the field in the zone of interest could be considered to be homogeneous to an order h if the number of rings $n_a$ in each structure is greater than or equal to $(h+1)/4$ and if the number of blocks in each ring is greater than or equal to $(h+1)$. These two simultaneous conditions lead to choosing a minimum structure in terms of the number of blocks, such that the number of blocks in each ring is equal to four times the number of rings in each structure.

In this respect, the structures shown in FIGS. 1b and 1c are optimum: there are three rings in each structure and twelve blocks in each ring. The magnet is homogeneous to the order 11. Another equally worthwhile magnet comprises, in each structure, two rings and eight blocks in each ring. This other magnet is homogeneous to the order 7. A magnet for which the structures would comprise only one ring and four blocks per ring would be homogeneous to the order 3 only, and little suited to nuclear magnetic resonance experiments. It could, however, be used for other ends. The structures with four rings and sixteen blocks per ring, homogeneous to the order 15, should be reserved for applications where the internal radius $r_1$ of the cylinder of the magnet is small. For reasons of simplification of fabrication, the number of blocks in each ring may be greater than the minimum indicated by the homogeneity to be achieved. On the other hand, in view of difficulties of installation, the number of rings is always taken at the minimum. The result thereof is that, in a preferred way, the number of blocks in a ring is greater than or equal to four times the number of rings of each of the two symmetrical structures.

In making all the rings of the magnet out of one and the same magnetic material, therefore comprising one and the same intrinsic internal magnetization, it has been possible to establish that the longitudinal coordinates $z_i$ and the radial dimensions $a_i$ and longitudinal dimensions $b_i$ of the rings could be given in terms of reduced value as a function of $r_1$ common to all the rings of the magnet cylinder. The following table gives all the preferred dimensions for the making of an example of a magnet such as this, where the field has the requisite homogeneity: here h equals 11.

| $-z'_1$ | $a_1$ | $b_1$ | $-z'_2$ | $a_2$ | $b_2$ | $-z'_3$ | $a_3$ | $b_3$ |
|---|---|---|---|---|---|---|---|---|
| 0.218 | 0.101 | 0.148 | 0.558 | 0.249 | 0.261 | 1.215 | 1.032 | 1.721 |

Knowing the value $B_O$ of a nominal field of induction reproduced, a magnetic material is adopted for which the intrinsic remanent magnetization at saturation $B_r$ has a corresponding value in a predetermined ratio $\alpha$ ($\alpha$ smaller than 1): $B_O = \alpha B_r$. It can be said that, for a fixed internal radius, the volume of magnetic material increases substantially as $\alpha^2$. By way of an indication, in a preferred exemplary embodiment, for an internal radius $r_1$ of the magnet equal to forty centimeters, a magnet was obtained, the total weight of which is of the order of eleven tons, with a strontium ferrite, and produces an internal field, the intensity of which is equal to 0.12 teslas. The remanent induction of the ferrite used is equal to about 0.4 teslas ($\alpha = 0.3$).

The construction of the magnet proper presents no particular difficulty. The rings may be formed, independently of one another, in maintaining the already magnetized blocks, by bonding, screwing in, or other means, between two flanges such as 25 and 26 (FIG. 2b). If necessary, this structure may be reinforced by a tube element 27 which will counteract the radial forces undergone by the magnetic blocks. This ring may be thus mounted in an armoring, the solidity, the thickness, of which is calculated mechanically as a function of the weight of the blocks of the ring and, above all, of the magnetic forces that it undergoes. Furthermore, when the structures are symmetrical, the blocks of two symmetrical rings may be connected externally by parts made of soft iron which ensure a better return of the lines of the induction field from one block to another. A part such as this is shown at 28 beneath the block 19 of FIG. 2b. The presence of these parts, however, is not totally necessary. For one and the same field $B_O$, they contribute to a reduction in the volume of material per magnet necessary, but they give the ab initio calculation of the dimensions of the blocks as well as the final setting of the magnet more tricky. It is then necessary to design the magnet, build it, measure the influence of these parts and start the operation again.

During the assembly of the magnet, the rings held by their flanges 25 and 26 are brought closer above the cradles such as 29 (FIG. 3). These cradles have setting screws 30 to lean on pommels 31 or 32 solidly joined to the flanges. In this way, it is possible to cause the rotation or shift of the ring in order to correct the homogeneity of the field on the site of installation of the magnet. There is thus a simple method available to correct the field. Furthermore, the cradles could be mounted on skids such as 33, which enable them to be shifted longitudinally to the axis z'z. It is then also possible to set the position of a ring in this direction so as to correct the homogeneity of the field.

In a preferred way, the magnetic materials used for the magnetic block are anisotropic magnetic materials: strontium ferrites or barium ferrites, samarium-cobalt alloys or iron-neodymium-boron alloys. In effect, in a a structure of this type, the demagnetizing excitation in the blocks is never colinear with the magnetization which, it is desired, should be radial. A choice is made from among these materials, according to their price and intensity of the field $B_O$ which it is sought to be obtained.

I claim:

1. A cylindrical permanent magnet with a cylindrical entrance along the axis of said cylinder and with a longitudinal induced field comprising two annular structures, placed on either side of the center of a zone of interest of the magnet, magnetized radially with respect to the cylinder axis with a magnetization which is divergent in one structure and convergent in the other, the structures each comprising several rings adjacent along said axis of said cylinder and, in each ring, several magnetic blocks, distributed on the rim of said rings, characterized in that the size of the blocks increases as their position is axially further away from the zone of interest.

2. Magnet according to claim 1, homogeneous to a given order h, h being a power of terms of a polynomial analytic expression representing the value of the induced field, characterized in that the number of rings in each structure is at least $(h+4)+/4$ and in that the number of blocks in each ring is at least $(h+1)$.

3. Magnet according to claim 1 or claim 2, characterized in that the structures are symmetrical with each other.

4. Magnet according to claim 3, characterized in that the internal diameters of the rings determined by the blocks are always equal to one another.

5. Magnet according to claim 2, characterized in that the number of blocks in a ring is at least four times the number of rings in the structure of this ring.

6. Magnet according to claim 4, characterized in that the number of rings is equal to two and in that the number of blocks in each ring is equal to eight.

7. Magnet according to claim 4, characterized in that the number of rings equals three and in that the number of blocks in each ring equals twelve.

8. Magnet according to any one of the claims 1 to 2, characterized in that it comprises means to shift the rings along the axis of the magnet.

9. Magnet according to any one of the claims 1 to 2, characterized in that it comprises means to shift the rings orthogonally to the axis of the magnet.

10. Magnet according to any one of the claims 1 to 2, characterized in that it comprises ancillary parts made of a material with high permeability connecting the structures to increase the magnetic field produced.

11. Magnet according to any one of the claims 1 to 2, characterized in that it comprises rings and blocks arranged and formed according to the following table to achieve an order 11 magnet, with values as a function of the inner radius,

| $-z'_1$ | $a_1$ | $b_1$ | $-z'_2$ | $a_2$ | $b_2$ | $-z'_3$ | $a_3$ | $b_3$ |
|---|---|---|---|---|---|---|---|---|
| 0.218 | 0.101 | 0.148 | 0.558 | 0.249 | 0.261 | 1.215 | 1.032 | 1.721 | where $z'_i$ represents the longitudinal dimension of an edge of the ring i, where $a_i$ represents the radial thickness of a block of this ring, and where $b_i$ represents the length of a block measured longitudinally.

12. Magnet according to any one of the claims 1 to 2, characterized in that it comprises ancillary parts made of a material with high permeability connecting the structures to reduce the volume of material needed to produce a given field.

* * * * *